United States Patent
Lee et al.

(10) Patent No.: US 7,183,660 B2
(45) Date of Patent: Feb. 27, 2007

(54) TAPE CIRCUIT SUBSTRATE AND SEMICONDUTOR CHIP PACKAGE USING THE SAME

(75) Inventors: Si-Hoon Lee, Gyeonggi-do (KR); Sa-Yoon Kang, Seoul (KR); Dong-Han Kim, Gyeonggi-do (JP)

(73) Assignee: Samsung Electronics Co., Ltd., Suwon-si (KR)

( * ) Notice: Subject to any disclaimer, the term of this patent is extended or adjusted under 35 U.S.C. 154(b) by 161 days.

(21) Appl. No.: 10/949,091

(22) Filed: Sep. 23, 2004

(65) Prior Publication Data

US 2005/0082647 A1  Apr. 21, 2005

(30) Foreign Application Priority Data

Oct. 4, 2003 (KR) .................. 10-2003-0069039

(51) Int. Cl.
 H01L 23/52  (2006.01)
 H01L 23/48  (2006.01)
 H01L 29/40  (2006.01)
(52) U.S. Cl. ............... 257/786; 257/668; 257/782; 257/785; 349/152; 349/151; 349/150; 438/118; 445/24
(58) Field of Classification Search ........ 257/E21.506, 257/E21.516, 668, 786, 782, 785, 690; 349/149–152; 445/24; 438/118; 350/339, 334
See application file for complete search history.

(56) References Cited

U.S. PATENT DOCUMENTS

| | | | | |
|---|---|---|---|---|
| 3,795,043 A | * | 3/1974 | Forlani .................. | 29/593 |
| 5,016,986 A | * | 5/1991 | Kawashima et al. ........ | 349/138 |
| 5,253,415 A | * | 10/1993 | Dennis .................. | 29/827 |
| 6,059,624 A | * | 5/2000 | Dehaine et al. .......... | 445/24 |
| 6,061,246 A | * | 5/2000 | Oh et al. ............... | 361/749 |
| 6,198,522 B1 | | 3/2001 | Yanagi ................. | 349/152 |
| 6,603,527 B1 | * | 8/2003 | Hayata et al. ........... | 349/152 |
| 6,930,744 B1 | * | 8/2005 | Ukita ................... | 349/152 |
| 2002/0080318 A1 | * | 6/2002 | Yamate et al. ........... | 349/149 |

FOREIGN PATENT DOCUMENTS

| | | |
|---|---|---|
| JP | 57-199228 | 12/1982 |
| JP | 9-55404 | 2/1997 |
| JP | 9-306946 | 11/1997 |
| JP | 2003-007765 | 1/2003 |
| JP | 2003-249592 | 9/2003 |

OTHER PUBLICATIONS

English language abstract of Japanese Publication No. 57-199228.
English language abstract of Japanese Publication No. 2003-007765.
English language abstract of Japanese Publication No. 2003-249592.
English language abstract of the Japanese Patent No. 9-55404.
English language abstract of the Japanese Patent No. 9-306946.

* cited by examiner

*Primary Examiner*—Kenneth Parker
*Assistant Examiner*—Chris Chu
(74) *Attorney, Agent, or Firm*—Marger Johnson & McCollom, P.C.

(57) ABSTRACT

A tape circuit substrate comprises a base film made of an insulating material, and a wiring pattern layer which is formed on the base film and has first leads that are connected to electrode pads arranged near a periphery of a semiconductor chip and second leads that are connected to electrode pads arranged near the center of the semiconductor chip. The semiconductor chip package comprises a semiconductor chip electrically bonded to the tape circuit substrate through chip bumps. In such a case, each of the leads is configured such that a tip end thereof to be bonded to the electrode pad has a width larger than that of a body portion thereof. According to the present invention, since the interval between the lead and the electrode pad can be made even narrower, a fine pitch semiconductor device can be realized.

15 Claims, 6 Drawing Sheets

TAPE CIRCUIT SUBSTRATE AND SEMICONDUTOR CHIP PACKAGE USING THE SAME

BACKGROUND OF THE INVENTION

This application claims the priority of Korean Patent Application No. 10-2003-69039 filed on Oct. 4, 2003, in the Korean Intellectual Property Office, the disclosure of which is incorporated herein in its entirety by reference.

1. Field of the Invention

The present invention relates to a semiconductor device, and more particularly, to a tape circuit substrate and a semiconductor chip package using the same, capable of meeting the trend towards fine pitch in a semiconductor chip pad.

2. Description of the Related Art

Due to trends toward thin, compact, high integrated, high-speed and high pin count semiconductor devices, tape circuit substrates are increasingly being used in the field of semiconductor chip mounting technology. The tape circuit substrate is configured such that wiring pattern layers and leads connected to the wiring pattern layers are formed on a thin film made of an insulating material such as polyimide resin. TAB (Tape Automated Bonding) technology for collectively bonding the leads of the tape circuit substrate to bumps previously formed on a semiconductor chip can be applied to the tape circuit substrate. Due to these characteristics, the tape circuit substrate is often called a TAB tape.

FIG. 1 is a partial plan view of a general tape circuit substrate.

Referring to FIG. 1, the general tape circuit substrate 100 is configured so that wiring pattern layers 140 are formed on a base film 120 made of an insulating material such as polyimide resin by performing a photoetching process for copper foil laminating. Further, the wiring pattern layers 140 are covered with and protected by a protection film 130 made of solder resist. To achieve electrical connection with a semiconductor chip, inner leads 140a connected to the wiring pattern layers 140 are exposed through the protection film 130 and protrude into a chip mounting portion 110. Here, the chip mounting portion 110 means a portion of the wiring pattern layer 140 where the protection film 130 is not formed for the semiconductor chip mounting.

FIGS. 2 and 3 are partial plan views showing leads of a tape circuit substrate with a semiconductor chip mounted thereon according to a related art.

FIG. 2 shows an in-line lead structure, and FIG. 3 shows a staggered lead structure.

As shown in FIG. 2, in the case of in-line lead structure, leads 210 are exposed through the protection film 130 and protrude side by side in the chip mounting portion 110. Tip ends of the leads 210 are electrically connected with electrode pads 220 of a semiconductor chip 250.

As shown in FIG. 3, in the case of staggered lead structure, leads 260 and 270 are exposed through the protection film 130 and protrude into the chip mounting portion 110. Further, tip ends of the leads 260 and 270 are alternately formed to be different in length so that they can be electrically connected with electronic pads 280 and 290 formed in a zigzag pattern on the semiconductor chip 250.

In other words, FIG. 1 is a schematic view of the TAB tape (tape circuit substrate 100) using the TAB technology, and FIGS. 2 and 3 are enlarged views of a predetermined region 150 of FIG. 1 and show a state where the semiconductor chip 250 is mounted on the tape circuit substrate. As shown in FIG. 1, the tape circuit substrate 100 is configured in such a manner that the leads 140a made of a metal (e.g., Cu) pattern are formed on a surface of the insulating base film 120 made of polyimide or polyester resin. The insulating base film 120 is provided with transport holes 160, which are used in a process of mounting the semiconductor chip on the TAB tape, at opposite side ends thereof along its longitudinal direction. The tip ends of the leads 140a protrude into the chip mounting portion 110 and are arranged in the chip mounting portion so that they can be electrically connected to the electrode pads (not shown) formed on the semiconductor chip.

Referring to FIGS. 2 and 3, the semiconductor chip 250 is first positioned in the chip mounting portion 110 of the tape circuit substrate 100 and the tip ends of the leads 210, 260 and 270 are arranged with, and thermally welded to, the electrode pads 220, 280 and 290 of the semiconductor chip 250, so that the leads 210, 260 and 270 can be electrically connected to the electrode pads 220, 280 and 290. At this time, in the case of in-line leads of FIG. 2, the leads 210 are electrically connected to the electrode pads 220 formed in a row on the semiconductor chip 250. On the contrary, in the case of staggered leads of FIG. 3, the long leads 260 are bonded to the electrode pads 280 positioned near the center of the semiconductor chip 250, whereas the short leads 270 are bonded to the electrode pads 290 positioned near the periphery of the semiconductor chip 250.

However, in the case of in-line leads of FIG. 2, even though intervals between the leads become narrower to cope with the fine pitch trend in the electrode pads of the semiconductor chip according to the recent trend toward thin, compact semiconductor devices, electrode pads whose widths are greater than those of the leads are required in the fundamental manufacturing process and predetermined intervals between the electrode pads are also required for preventing the electrode pads from being short-circuited. Therefore, there is limitation in achieving fine pitch leads.

Furthermore, in the case of staggered leads of FIG. 3, since the electrode pads are arranged in a zigzag pattern, unlike the in-line leads of FIG. 2, the problem of short circuits between electrode pads can be somewhat solved and the average pitch between leads can also be reduced as compared with the in-line leads. However, intervals between the electrode pads 290 of widths generally larger than those of the leads 260 passing by the vicinity of the electrode pads 290 should be kept at a predetermined distance for preventing the possibility of a short circuit between them, so there is also a limitation in implementing or realizing fine pitch leads.

SUMMARY OF THE INVENTION

The present invention is conceived to solve the aforementioned problems. An objective of the present invention is to provide a tape circuit substrate and semiconductor chip package using the same, capable of coping with the trend toward fine pitch in tape circuit substrates. Accordingly, the present invention aims to miniaturize a semiconductor chip through a fine pitch tape circuit substrate and to prevent the occurrence of a short circuit between leads.

According to an aspect of the present invention for achieving the objective, there is provided a tape circuit substrate, comprising a base film made of an insulating material, and a wiring pattern layer which is formed on the base film and includes first leads that are connected to electrode pads arranged near a periphery of a semiconductor chip and second leads that are connected to electrode pads arranged near the center of the semiconductor chip. In such a case, each of the leads is preferably configured such that a tip end thereof to be bonded to the electrode pad has a width larger than that of a body portion thereof.

Preferably, the width of the tip end of the lead is within a range of 10~17 μm.

Preferably, the width of the body portion of the lead is 0.3~0.9 times as large as that of the tip end of the lead.

Preferably, the first and second leads are alternately arranged and the tip ends of the first and second leads are arranged in a zigzag pattern.

Preferably, the wiring pattern layer except its portions electrically connected to the outside is sealed with solder resist.

Preferably, the base film is formed with a window for mounting the semiconductor chip on the tape circuit substrate and the leads protrude into the window.

According to another aspect of the present invention for achieving the objective, there is provided a semiconductor chip package which comprises a tape circuit substrate including a base film made of an insulating material, and a wiring pattern layer which is formed on the base film and has first leads that are connected to electrode pads arranged near a periphery of a semiconductor chip and second leads that are connected to electrode pads arranged near the center of the semiconductor chip; and a semiconductor chip which includes a plurality of electrode pads with bonded portions formed thereon at a main surface thereof, wherein the semiconductor chip is bonded to the leads of the wiring pattern layer through the bonded portions so that the semiconductor chip can be mounted on the tape circuit substrate. In such a case, each of the leads is preferably configured such that a tip end thereof to be bonded to the electrode pad has a width larger than that of a body portion thereof;

Preferably, the bonded portions for electrically connecting the electrode pads and the leads are chip bumps.

BRIEF DESCRIPTION OF THE DRAWINGS

The above and other objects, features and advantages of the present invention will become apparent from the following description of preferred embodiments given in conjunction with the accompanying drawings, in which.

DETAILED DESCRIPTION OF THE INVENTION

Preferred embodiments of the present invention will be described in detail with reference to the accompanying drawings so that those skilled in the art can easily carry out the present invention.

Figure 1:
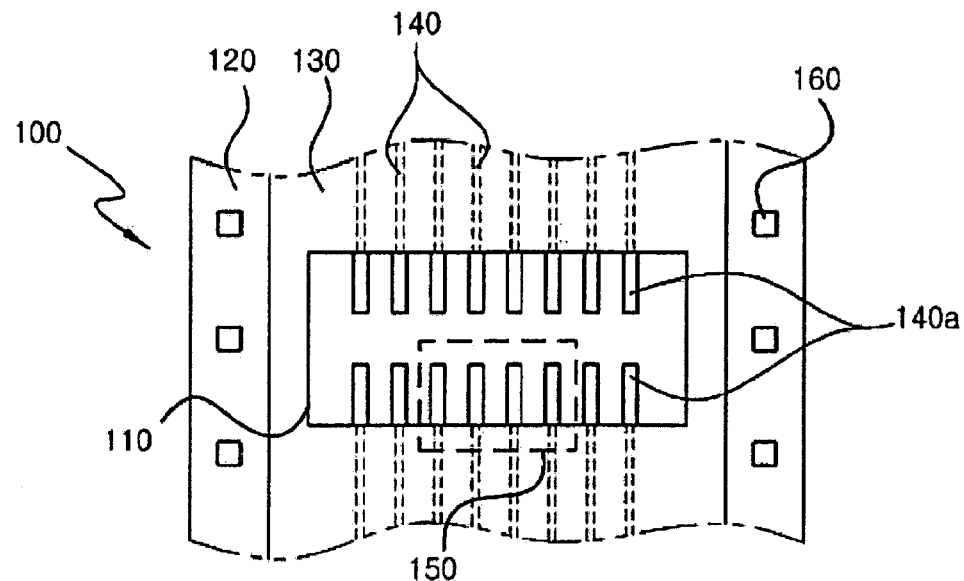
FIG. 1 is a partial plan view showing a general tape circuit substrate.
Figure 2:
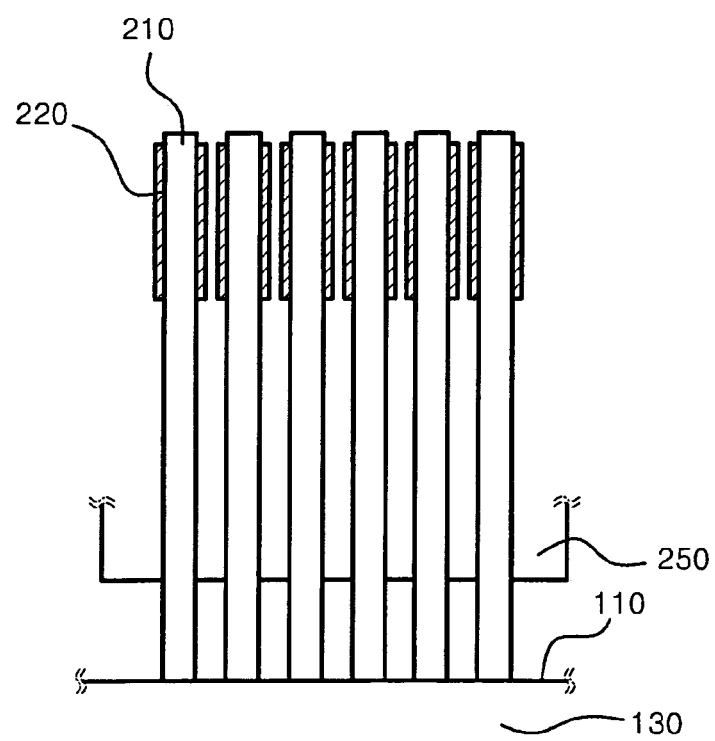
FIGS. 2 and 3 are partial plan views showing leads of the related art tape circuit substrate on which a semiconductor chip is mounted.
Figure 3:
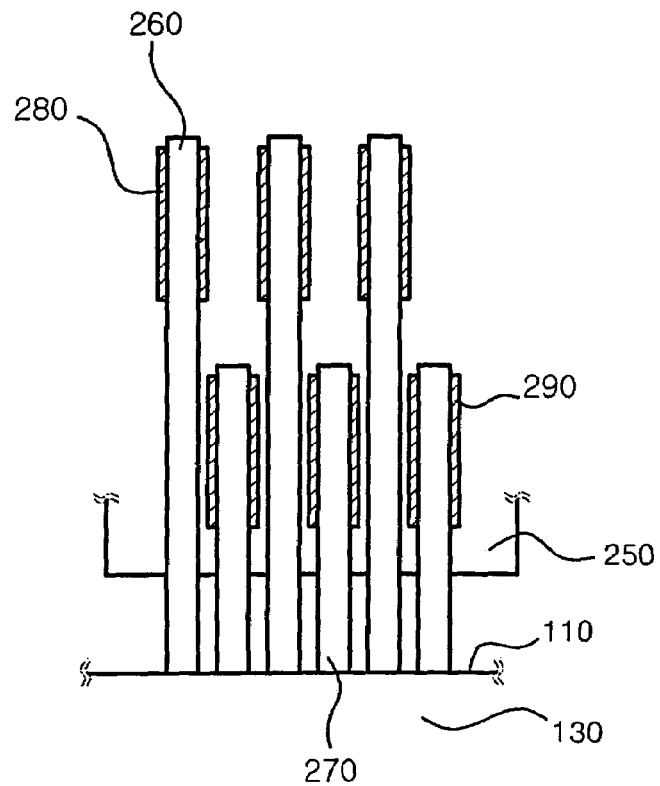
Figure 4A:
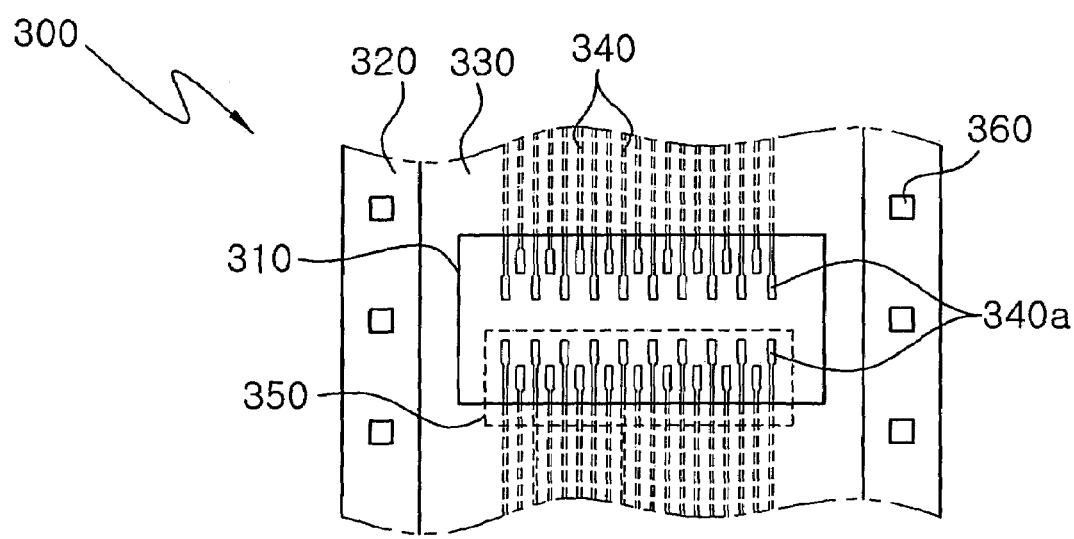
FIGS. 4a and 4b are partial plan views showing a tape circuit substrate according to an embodiment of the present invention.
Figure 4B:
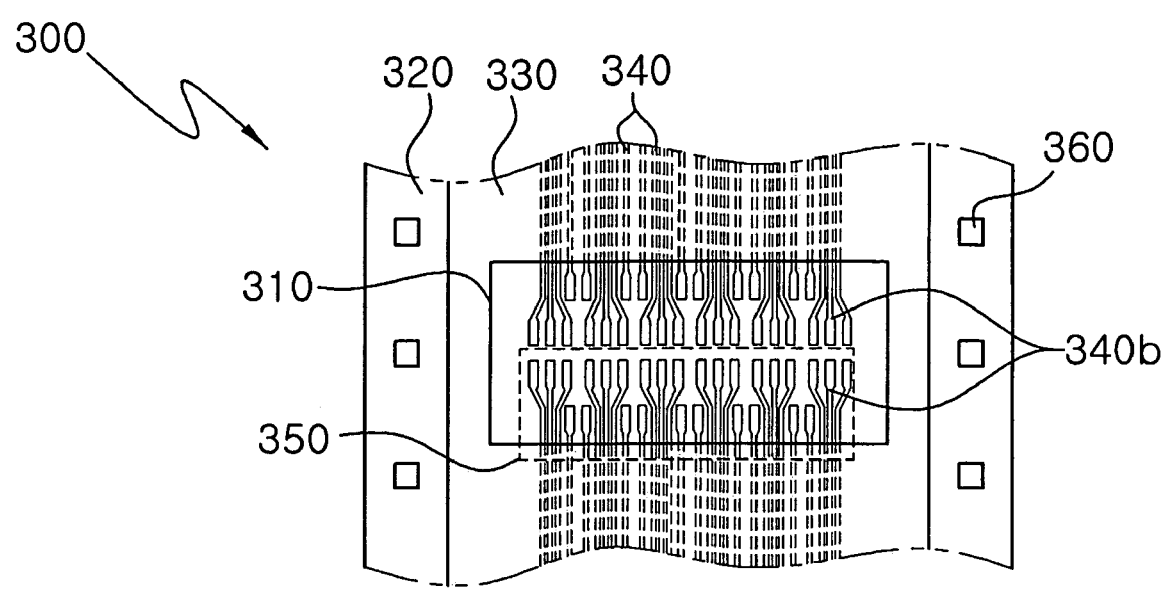

FIGS. 4a and 4b are partial plan views showing a tape circuit substrate according to an embodiment of the present invention.

Figure 5:
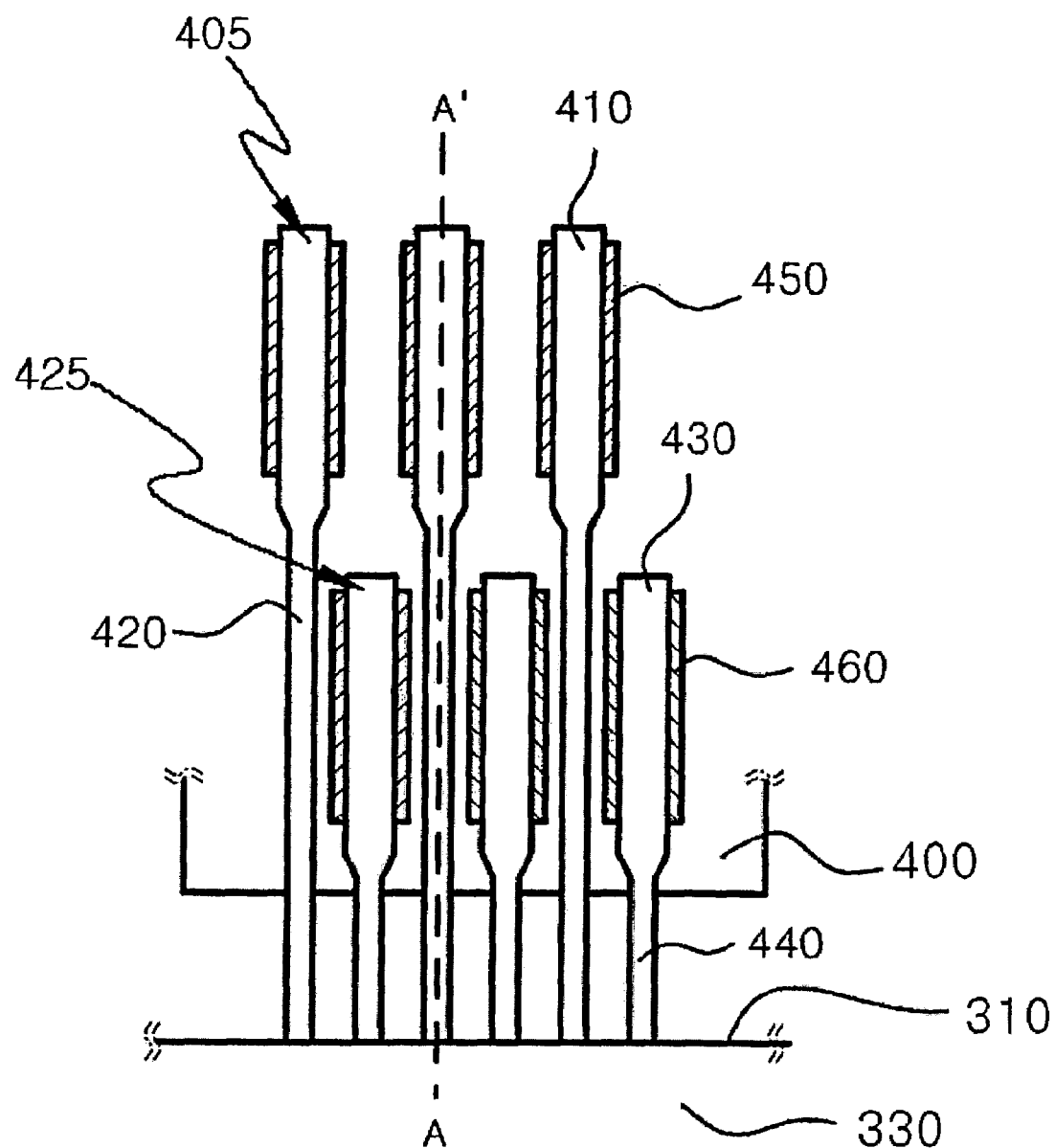
FIG. 5 is a partial plan view showing a lead structure of the tape circuit substrate with a semiconductor chip mounted thereon according to an embodiment of the present invention.

FIG. 5 is a partial plan view showing leads of the tape circuit substrate with a semiconductor chip mounted thereon according to the embodiment of the present invention, and more specifically shows a partial enlarged view of a predetermined region 350 of FIG. 4a.

Referring to FIGS. 4a and 5, a semiconductor chip package 300 according to the embodiment of the present invention comprises a tape circuit substrate including a base film 320 and a wiring pattern layer 340, and a semiconductor chip 400 that is electrically connected with the tape circuit substrate.

Hereinafter, the tape circuit substrate according to the embodiment of the present invention will be first discussed.

The base film 320 is made of an insulating material with a thickness of 20~100 μm. Here, a window may be formed at a portion on the base film 320 where the semiconductor chip 400 is to be mounted. In such a case, the tape circuit substrate is called a tape carrier package (hereinafter, referred to as "TCP"). Alternatively, a window may not be formed at the portion on the base film 320 where the semiconductor chip 400 is to be mounted. In this case, the tape circuit substrate is called a chip on film (hereinafter, referred to as "COF"). The tape circuit substrate of the present invention includes the TCP or COF to which the TAB technology is applied. The insulating base film 320 can be typically made of polyimide resin, already well known in the art.

The wiring pattern layer 340 is formed on the base film 320. The wiring pattern layer 340 is made of a conductive material and may be generally made of copper foil. Preferably, Sn, Au, Ni or solder is plated on a surface of the copper foil.

The insulating base film 320 is provided with transport holes 360, which are used in a process of mounting the semiconductor chip on the TAB tape, at opposite side ends thereof along its longitudinal direction.

A method of forming the copper foil on the top surface of the base film 320 includes a casting process, a laminating process, an electroplating process and the like. The casting process is a method of attaching a liquid base film to the rolled copper foil and thermally curing them. The laminating process is a method of putting the rolled copper foil on the base film and thermally welding them. The electroplating process is a method of depositing a copper seed layer on the base film, putting the base film into an electrolyte solution in which copper is dissolved, and forming the copper foil by applying the electricity into the electrolyte solution.

To form the wiring pattern layer on the copper foil, the copper foil is selectively etched by performing a photoetching process on the copper foil. Consequently, the wiring pattern layer 340 with a predetermined circuit is formed.

As shown in FIG. 4a, the wiring pattern layer 340 formed on the base film 320 is covered with and protected by a protection film 330 made of solder resist. This protection film 330 fully covers the top surface of the base film 320 so that the wiring pattern layer 340 cannot be exposed to the outside. However, leads 340a that are electrically connected with the semiconductor chip 400 are not covered with the protection film 330. That is, the leads 340a that are connected to the wiring pattern layer 340 for the electrical connection with the semiconductor chip are exposed through the protective film 330 and protrude into a chip mounting portion 310. Here, the chip mounting portion 310 means a portion of the wiring pattern layer 340 where the protection film 330 is not formed for the semiconductor chip mounting.

FIG. 5 is a plan view showing a lead structure of the tape circuit substrate according to the embodiment of the present invention. The leads 405 and 425 extending from the wiring pattern layer 340 are formed on the base film 320. The leads 405 and 425 are formed to protrude from the protection film 330 made of solder resist that fully cover the top surface of the base film 320 so that the wiring pattern layer 340 cannot be exposed to the outside.

The electrode pads that are formed on the semiconductor chip 400 for electrically connecting the semiconductor chip 400 with the leads 405 and 425 include electrode pads 460 positioned near the periphery of the semiconductor chip 400 and electrode pads 450 positioned near the center of the semiconductor chip 400.

The leads 405 and 425, which protrude into the chip mounting portion 310 to be electrically connected with the electrode pads 450 and 460 formed on the semiconductor chip 400, are formed with their tip ends 410 and 430 at positions corresponding to the electrode pads 450 and 460. The leads 405 and 425 are classified into the first leads 425 that are bonded to the electrode pads 460 positioned near the periphery of the semiconductor chip 400 and the second leads 405 that are bonded to the electrode pads 450 positioned near the center of the semiconductor chip 400.

Although it has been described herein that the portions of the leads 405 and 425 which are bonded to the electrode pads 450 and 460 are the tip ends 410 and 430 of the leads 405 and 425, the connecting portions of the leads 405 and 425 with the electrode pads 450 and 460 are not limited to these tip ends 410 and 430 but include any portion thereof that can be bonded to the electrode pads 450 and 460. For the convenience of explanation, however, the connection portions of the leads 405 and 425 are hereinafter referred to as the tip ends 410 and 430 of the leads 405 and 425, respectively.

In a case where the electrode pads are formed in a row on the semiconductor chip 400, the leads bonded to the electrode pads are formed in an in-line type. In such a case, since predetermined intervals are required between the electrode pads whose widths are larger than those of the leads for the prevention of short circuit between the wirings, it is difficult to implement fine pitch circuit substrate. Therefore, to realize a fine pitch circuit, it is preferred that the electrode pads 450 and 460 be arranged in a zigzag pattern on the semiconductor chip 400 and the tip ends 410 and 430 of the leads 405 and 425 be formed on the corresponding positions of the electrode pads 450 and 460, respectively, as described above in the embodiment of the present invention. Such a lead structure is called a staggered-type lead structure.

As shown in FIG. 5, it is preferred that the first leads 425 and the second leads 405 be alternately arranged and that the tip ends 430 of the first leads 425 and the tip ends 410 of the second leads 405 be arranged in a zigzag pattern.

The structure of the leads 405 and 425 will be described in detail with reference to FIG. 5. Each of the leads 405 and 425 includes the lead tip end 410 and 430 that is electrically connected to each of the electrode pads 450 and 460 formed on the semiconductor chip 400 and the lead body portion 420 and 440 that causes the lead tip end 410 and 430 to be connected to the wiring pattern 340.

The width of the lead body portion 420 and 440 is smaller than that of the lead tip end 410 and 430. Smaller widths of the lead body portions 420 and 440 allow the intervals between the leads to be much narrower in the staggered-type lead structure. Therefore, a finer pitch circuit can be implemented or realized.

Since the lead tip ends 410 and 430 are subjected to a thermal welding process for their electrical connection with the semiconductor chip 400, the widths of the lead tip ends 410 and 430 should be greater than a predetermined value to avoid broken-lead phenomenon due to changes in temperature and pressure. That is, if the bonding area between the lead tip ends 410 and 430 and the electrode pads 450 and 460 is decreased, bonding strength is lowered and bonding reliability is deteriorated. Therefore, the widths of the lead tip ends 410 and 430 should be greater than the predetermined value. It is preferred that the widths of the lead tip ends 410 and 430 be about 10~17 μm from the viewpoint of the current manufacturing process.

Preferably, the lead body portions 420 and 440 are about 0.3~0.9 times as wide as the lead tip ends 410 and 430. Contrary to the lead tip ends 410 and 430, the lead body portions 420 and 440 are not subjected directly to the thermal welding process with the semiconductor chip 400. Thus, broken-lead phenomenon does not occur even if the widths of the lead body portions 420 and 440 are smaller than those of the lead tip ends 410 and 430. However, to maintain unique strength and stability of the leads, the widths of the lead body portions 420 and 440 are preferably 0.3 times or more as large as those of the lead tip ends 410 and 430 from the viewpoint of the current manufacturing process.

As shown in FIG. 5, an interval between the lead body portion 420 of the second lead 405 and the electrode pad 460 bonded to the lead tip end 430 of the adjacent first lead 425 is set to a minimum interval determined by a design rule from the viewpoint of the manufacturing process.

The leads 405 and 425 can be manufactured in the same process as the related art, if a mask used for forming the metal wiring pattern is merely changed. Thus, it is possible to produce the leads using the same equipment as in the related art without any additional manufacturing processes.

Figure 6:
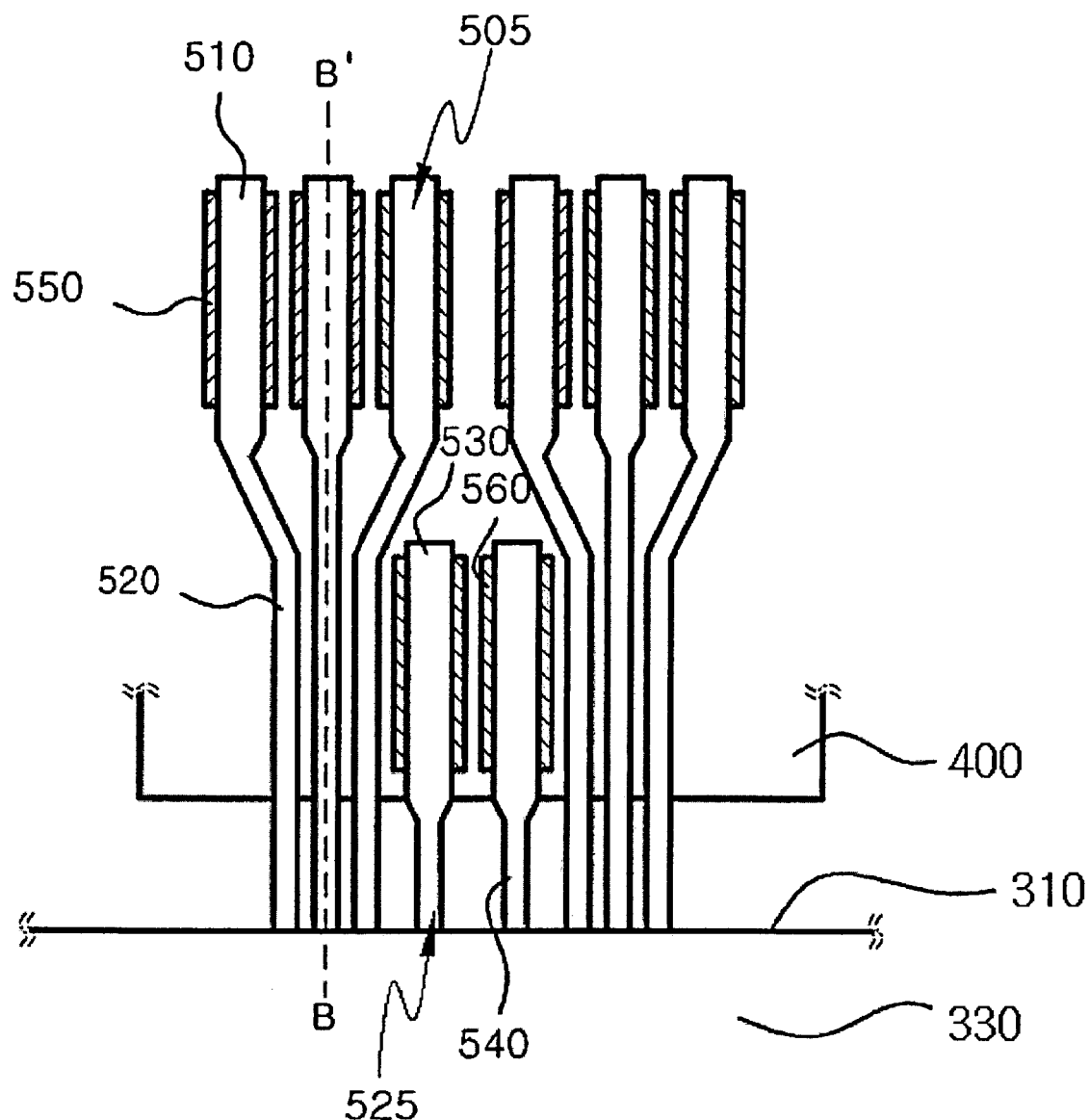
FIG. 6 is a plan view showing a lead structure of a tape circuit substrate according to another embodiment of the present invention.

FIG. 6 is a plan view showing a lead structure of the tape circuit substrate according to another embodiment of the present invention. FIG. 6 is a partially enlarged view showing a predetermined region 350 of FIG. 4b.

Referring to FIGS. 4b and 6, a semiconductor chip package according to this embodiment of the present invention comprises a tape circuit substrate including a base film 320 and a wiring pattern layer 340, and a semiconductor chip 400 that is electrically connected with the tape circuit substrate.

Hereinafter, the tape circuit substrate according to this embodiment of the present invention will be first described.

The base film 320 is made of an insulating material with its thickness of 20~100 μm. Here, a window may be formed at the portion on the base film 320 where the semiconductor chip 400 is mounted. In such a case, the tape circuit substrate is called a tape carrier package (hereinafter, referred to as "TCP"). Alternatively, a window may not be formed at the portion on the base film 320 where the semiconductor chip 400 is mounted. In this case, the tape circuit substrate is called a chip on film (hereinafter, referred to as "COF"). The tape circuit substrate of the present invention includes the TCP or COF to which the TAB technology is applied. The insulating base film 330 can be typically made of a polyimide resin already well known in the art.

The wiring pattern layer 340 is formed on the base film 320. The wiring pattern layer 340 is made of a conductive material and may be generally made of copper foil. Preferably, Sn, Au, Ni or solder is plated on the surface of the copper foil.

Methods of forming copper foil on a top surface of the base film 320 include a casting process, a laminating process, an electroplating process and the like. The casting process is a method of attaching a liquid base film to the rolled copper foil and thermally curing them.

To form the wiring pattern layer on the copper foil, the copper foil is selectively etched by performing a photo-etching process on the copper foil. Consequently, the wiring pattern layer 340 with a predetermined circuit is formed.

As shown in FIG. 4b, the wiring pattern layer 340 formed on the base film 320 is covered with and protected by the protection film 330 made of solder resist. This protection film 330 fully covers the top surface of the base film 320 so that the wiring pattern layer 340 cannot be exposed to the outside. However, leads 340b that are electrically connected with the semiconductor chip 400 are not covered with the protection film 330. That is, the leads 340b that are connected to the wiring pattern layer 340 for the electrical connection with the semiconductor chip are exposed from the protective film 330 and protrude into the chip mounting portion 310. Here, the chip mounting portion 110 means the portion of the wiring pattern layer 340 where the protection film 330 is not formed for the semiconductor chip mounting.

FIG. 6 is a plan view showing a lead structure of the tape circuit substrate according to another embodiment of the present invention. The leads 505 and 525 extending from the wiring pattern layer 340 are formed on the base film 320. The leads 505 and 525 are formed to protrude from the protection film 330 made of solder resist for fully covering the top surface of the base film 320 so that the wiring pattern layer 340 cannot be exposed to the outside.

The electrode pads that are formed on the semiconductor chip 400 for electrically connecting the semiconductor chip 400 with the leads 505 and 525 include electrode pads 560 positioned near the periphery of the semiconductor chip 400 and electrode pads 550 positioned near the center of the semiconductor chip 400.

The leads 505 and 525, which protrude into the chip mounting portion 310 to be electrically connected with the electrode pads 550 and 560 formed on the semiconductor chip 400, are formed with their tip ends 510 and 530 at positions corresponding to the electrode pads 550 and 560. The leads 505 and 525 are classified into first leads 525 that are bonded to the electrode pads 560 positioned near the periphery of the semiconductor chip 400 and second leads 505 that are bonded to the electrode pads 550 positioned near the center of the semiconductor chip 400.

Although it has been described herein that the portions of the leads 505 and 525 which are bonded to the electrode pads 550 and 560 are the tip ends 510 and 530 of the leads 505 and 525, the connecting portions of the leads 505 and 525 with the electrode pads 550 and 560 are not limited to these tip ends 510 and 530 but include any portion thereof that can be bonded to the electrode pads 550 and 560. For convenience of explanation, however, the connection portions of the leads 505 and 525 are hereinafter referred to as the tip ends 510 and 530 of the leads 505 and 525, respectively.

As shown in FIG. 6, the predetermined number of first leads 525 and the predetermined number of second leads 505 are alternately arranged.

The structure of the leads 505 and 525 will be described in detail with reference to FIG. 6. Each of the leads 505 and 525 includes a lead tip end 510 and 530 that is electrically connected to each of the electrode pads 550 and 560 formed on the semiconductor chip 400 and a lead body portion 520 and 540 that causes the lead tip end 510 and 530 to be connected to the wiring pattern 340, respectively.

The width of the lead body portion 520 and 540 is smaller than that of the lead tip end 510 and 530. Smaller widths of the lead body portions 520 and 540 allow the intervals between the leads to be much narrower in a staggered-type lead structure. Therefore, a finer pitch circuit can be implemented or realized.

Since the lead tip ends 510 and 530 are subjected to the thermal welding process for the electrical connecting with the semiconductor chip 400, the widths of the lead tip ends 510 and 530 should be greater than a predetermined value to avoid broken-lead phenomenon due to changes in temperature and pressure. That is, if a bonding area between the lead tip ends 510 and 530 and the electrode pads 550 and 560 is decreased, bonding strength is lowered and bonding reliability is deteriorated. Therefore, the widths of the lead tip ends 510 and 530 should be greater than the predetermined value. It is preferred that the widths of the lead tip ends 510 and 530 be about 10~17 μm from the viewpoint of the current manufacturing process.

Preferably, the lead body portions 520 and 540 are about 0.3~0.9 times as wide as the lead tip ends 510 and 530. Contrary to the lead tip ends 510 and 530, the lead body portions 520 and 540 are not subjected directly to the thermal welding process with the semiconductor chip 400. Thus, broken-lead phenomenon does not occur even if the widths of the lead body portions 520 and 540 are smaller than those of the lead tip ends 510 and 530. However, to maintain unique strength and stability of the leads, the widths of the lead body portions 520 and 540 are preferably 0.3 times or more as large as those of the lead tip ends 510 and 530 from the viewpoint of the current manufacturing process.

As shown in FIG. 6, an interval between the lead body portion 520 of the second lead 505 and the electrode pad 560 bonded to the lead tip end 530 of the adjacent first lead 525 is set to a minimum interval determined by a design rule from the viewpoint of the manufacturing process.

The leads 505 and 525 can be manufactured in the same process as the related art, if a mask used for forming the metal wiring pattern is merely changed. Thus, it is possible to produce the leads using the same equipment as in the related art without any additional manufacturing processes.

Although it has been described by way of example in the preferred embodiments of the present invention that the lead tip ends 410, 430, 510 and 530 protruding into the chip mounting portion 310 take the shape of a rectangle, the present invention is not limited to such a shape. For example, the lead tip ends 410, 430, 510 and 530 may take the shape of a circle or ellipse. Further, even though there is a little distortion in the shapes of the tip ends or some bulged portions in the tip ends within error tolerances, the effects of the embodiments of the present invention are the same as one another. Furthermore, it is apparent that the material and thickness of the insulating base film and the materials and widths of the leads are not limited to the foregoing embodiments of the present invention.

Figure 7:
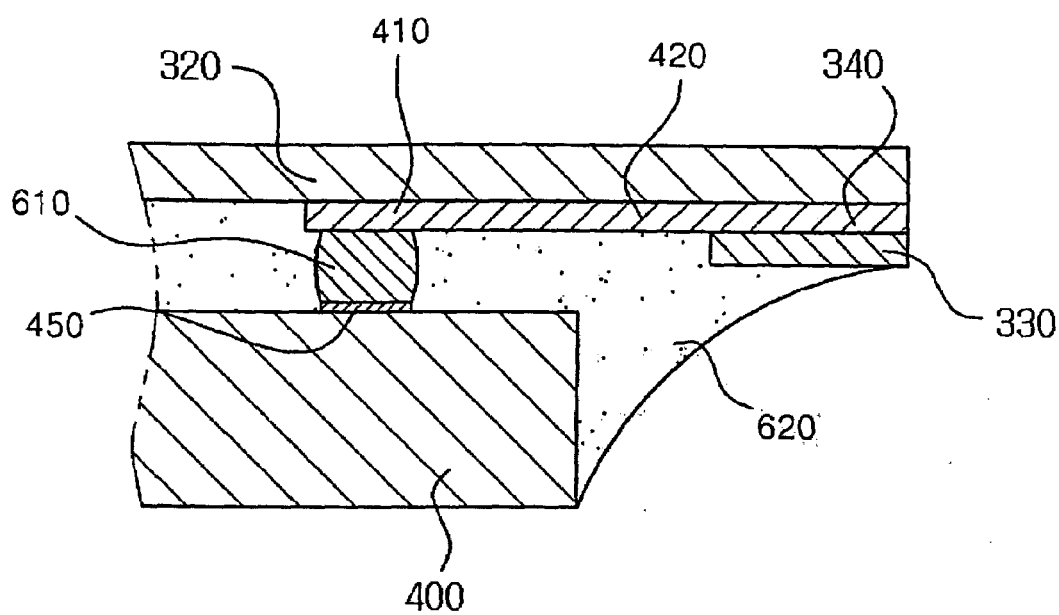
FIG. 7 is a sectional view of a semiconductor chip package according to an embodiment of the present invention.

FIG. 7 is a sectional view of the semiconductor chip package according to an embodiment of the present invention. More specifically, FIG. 7 is a sectional view of the semiconductor chip package taken along line A-A' of FIG. 5. The semiconductor chip package will be described with reference to FIGS. 4a and 7.

As shown in FIGS. 4a and 7, the semiconductor chip package of this embodiment of the present invention comprises the tape circuit substrate including the base film 320 and the wiring pattern layer 340, and the semiconductor chip 400 that is electrically connected with the tape circuit substrate.

The plurality of electrode pads 450 arranged on the main surface of the semiconductor chip 400 and the tip ends of the leads 410 are electrically connected through connecting portions 610. Chip bumps may be used as bonded portions 610 for electrically connecting the tape circuit substrate and the semiconductor chip 400. Therefore, the tip end of the lead 410 and the electrode pad 450 on the semiconductor chip 400 are electrically connected through the chip bump 610. The chip bump 610, the electrode pad 450 formed on the main surface of the semiconductor chip 400, and the lead tip end 410 can be bonded to one another through the thermal welding process. Such a chip bump 610 can be made of a variety of materials such as Au, Cu and solder.

The electrical connections between the leads of the wiring pattern layer in the tape circuit substrate and the semiconductor chip 400 and the main surface of the semiconductor chip 400 are sealed by a sealing portion 620 made of an insulation sealing resin. The sealing portion 620 can be made of an epoxy or silicon resin.

Referring to FIG. 7, reference numerals 710 and 720 respectively designate a chip bump and a sealing portion.

Figure 8:
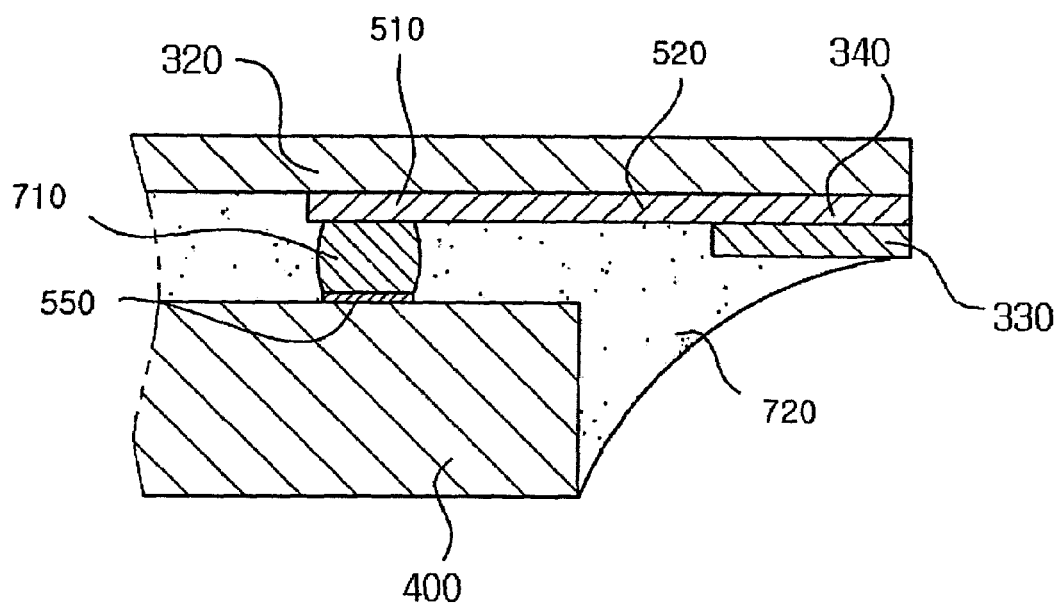
FIG. 8 is a sectional view of a semiconductor chip package according to another embodiment of the present invention.

FIG. 8 is a sectional view of the semiconductor chip package according to another embodiment of the present invention. More specifically, FIG. 8 is a sectional view of the semiconductor chip package taken along line B-B' of FIG. 6. Since FIG. 8 is substantially the same as FIG. 7 in view of the configuration of the semiconductor chip package, the description thereof will be omitted.

According to the present invention, leads of a tape circuit substrate can be configured in a staggered type and the widths of portions other than the tip end of each lead can be smaller than that of the tip end of the lead that is connected with each electrode pad on a semiconductor chip. Therefore, a fine pitch tape circuit substrate or semiconductor chip package can be realized. That is, the interval between the lead and the electrode pad can be made even narrower, i.e. the pitch between the leads can be reduced, and thus, a fine pitch semiconductor device can be realized.

Although the present invention has been described in connection with the preferred embodiments thereof, it is not limited to the preferred embodiments. It will be apparent to those skilled in the art that various changes and modifications can be made thereto without departing from the scope and spirit of the present invention defined by the appended claims.

What is claimed is:

1. A semiconductor chip package, comprising:
a tape circuit substrate including a base film made of an insulating material, and a wiring pattern layer that is formed on the base film and has first leads that are connected to electrode pads arranged near a periphery of a semiconductor chip and second leads that are connected to electrode pads arranged near a center of the semiconductor chip, wherein each of the first and second leads is configured so that a tip end thereof to be bonded to its respective electrode pad has a width larger than that of a body portion thereof; and the semiconductor chip that includes a plurality of electrode pads with chip bumps formed thereon at a main surface thereof, wherein the semiconductor chip is bonded to the first and second leads of the wiring pattern layer through the chip bumps so that the semiconductor chip can be mounted on the tape circuit substrate, wherein the tip end of each of the first and second leads has a width smaller than that of the chip bumps.

2. The semiconductor chip package as claimed in claim 1, wherein the width of the tip end of each of the first and second leads is within a range of 10~17 μm.

3. The semiconductor chip package as claimed in claim 1, wherein a width of the body portion of each of the first and second leads is 0.3~0.9 times as large as that of the tip end of each respective lead.

4. The semiconductor chip package as claimed in claim 1, wherein the first and second leads are alternately arranged and the tip ends of the first and second leads are arranged in a zigzag pattern.

5. The semiconductor chip package as claimed in claim 1, wherein the wiring pattern layer except its portions electrically connected to an outside is sealed with a solder resist.

6. The semiconductor chip package as claimed in claim 1, wherein the base film is formed with a window to mount the semiconductor chip on the tape circuit substrate and the first and second leads protrude into the window.

7. The semiconductor chip package as claimed in claim 6, wherein the width of the tip end of each of the first and second leads is within a range of 10~17 μm.

8. The semiconductor chip package as claimed in claim 7, wherein the width of the body portion of each of the first and second leads is 0.3~0.9 times as large as that of the tip end of each respective lead.

9. The semiconductor chip package as claimed in claim 6, wherein the first and second leads are alternately arranged and the tip ends of the first and second leads are arranged in a zigzag pattern.

10. The semiconductor chip package as claimed in claim 6, wherein the wiring pattern layer except its portions electrically connected to an outside is sealed with a solder resist.

11. The semiconductor chip package as claimed in claim 1, wherein a plurality of the first leads form a first group and a plurality of the second leads from a second group, the first and second group being arranged in a zigzag pattern with respect to each other.

12. The semiconductor chip package as claimed in claim 11, wherein the plurality of the first leads in the first group are arranged in a line.

13. The semiconductor chip package as claimed in claim 12, wherein the plurality of the second leads in the second group are arranged in a line.

14. The semiconductor chip package as claimed in claim 13, wherein each of the plurality of the first leads in the first group have lengths equal to each other.

15. The semiconductor chip package as claimed in claim 14, wherein each of the plurality of the second leads in the second group have lengths equal to each other.

* * * * *